United States Patent [19]

Toh et al.

[11] Patent Number: 5,669,599
[45] Date of Patent: Sep. 23, 1997

[54] MAGNETIC BOATS

[75] Inventors: Hong Seng Toh, Phoenix, Ariz.; Frederick P. Eickmann; James V. Clark, both of Palm Bay, Fla.

[73] Assignee: Harris Corporation, Melbourne, Fla.

[21] Appl. No.: 552,711

[22] Filed: Nov. 3, 1995

[51] Int. Cl.⁶ .................................................. B25B 11/00
[52] U.S. Cl. .................................................. 269/8; 269/903
[58] Field of Search ........................... 269/8, 15, 16, 269/903; 206/818; 279/128; 361/234, 145

[56] References Cited

U.S. PATENT DOCUMENTS

| | | | |
|---|---|---|---|
| 4,282,975 | 8/1981 | Ovadia | 206/818 |
| 5,221,006 | 6/1993 | Plumlee et al. | 206/818 |
| 5,316,143 | 5/1994 | Horn | 206/818 |
| 5,405,004 | 4/1995 | Vest et al. | 206/818 |

*Primary Examiner*—Robert C. Watson
*Attorney, Agent, or Firm*—Daniel J. Staudt

[57] ABSTRACT

An assembly is disclosed for supporting and transporting integrated circuits (ICs) or circuit die. The ICs are held to a planar surface of a support plate by a magnet. Support plates can optionally be perforated in order to view and inspect the circuits being processed and allows fluids and gases to pass therethrough. A separator plate is used when a plurality of support plates are stacked on top of each other to separate the support plates. The support plates can be placed in a container to transport the circuits during the manufacturing process. The container and separator plate can also be perforated.

11 Claims, 3 Drawing Sheets

MAGNETIC BOATS

The invention relates to an assembly for transporting Integrated Circuits during the assembly and manufacturing process, and in particular transporting the Integrated Circuits within baskets while holding the Integrated Circuits in place in the baskets with magnets.

BACKGROUND AND PRIOR ART

During manufacturing and assembling processes, Integrated Circuit packages (ICs), are transported within baskets and trays. The ICs are loosely supported by the trays and baskets as they pass through the assembly and testing procedure. The movement of the ICs causes a variety of problems. For example the ICs in the basket slide around and usually contact each other, thus damaging each other.

Another problem with the ICs sliding is that the leads of the ICs can bend and become damaged due to the contacting with other ICs. Further, the ICs contacting the basket's side walls or tray during the manufacturing process cause damage. Yet another problem is that the leads are nickel plated and this nickel can be deposited onto the package of a contacted IC. This deposited nickel on the package can provide a short between the leads, thus causing damage to the circuits of the IC. Still another problem is the marring and scratching of the surface which can inhibit the subsequent branding of the IC packages.

Other problems occur as a result of the necessity of constantly handling the packages in a batch (200 or more together). Since the ICs are handled in batch, the packages are constantly touched by operators during each step of the manufacturing and assembling process. Thus, the more the handling, the greater the electrostatic discharge (ESD) damage that can occur to the IC. These problems have in part been solved by automating the process, but there is still a need for handling the ICs by the operator and material handlers during the manufacturing process.

In the past magnets have been used to hold and support metallic objects during the manufacturing and assembling operations of a variety of products. Conveyor belts incorporating magnets have been used to transport metal objects from one assembly location to another. These uses have been limited to holding the products on the conveyor belt or apparatus and were not directed to preventing the products from contacting each other. Others have used magnets to hold product in position during the assembly process. For example, a magnet arrangement has been used to secure a lid to a package body during the hermetic sealing operation of a semiconductor device.

Thus there is a need to provide a system and apparatus for an improved transportation of all types of integrated circuits during the manufacturing process.

SUMMARY THE INVENTION

It is an object of the present invention to provide a means of transporting the ICs that prevents the ICs from contacting each other, thus damaging each other. A further object is to provide a means of transporting the ICs that prevents damage due to electrostatic discharge (ESD). Yet, another object of the invention is to provide a means of transporting ICs through the manufacturing process steps.

An embodiment of the invention provides a perforated metallic support plate with a magnetic fixed to the plate. The magnetic holds the ICs in place on the surface of the perforated plate. The plates can be stacked such that a plurality of plates maintains a plurality of ICs in place during the manufacturing process. The plates of the invention can be rectangular or circular shaped and may be perforated in order to allow any chemicals or gases to pass through the plates during the manufacturing process.

If the plates are stacked they can be separated by a separator plate which provides a means of separating the stacked plates and further prevents the circuits from contacting each other. Further objects and advantages of this invention will be apparent from the following detailed description of the invention which is illustrated in the accompanying drawings.

DETAILED DESCRIPTION

Figure 1:
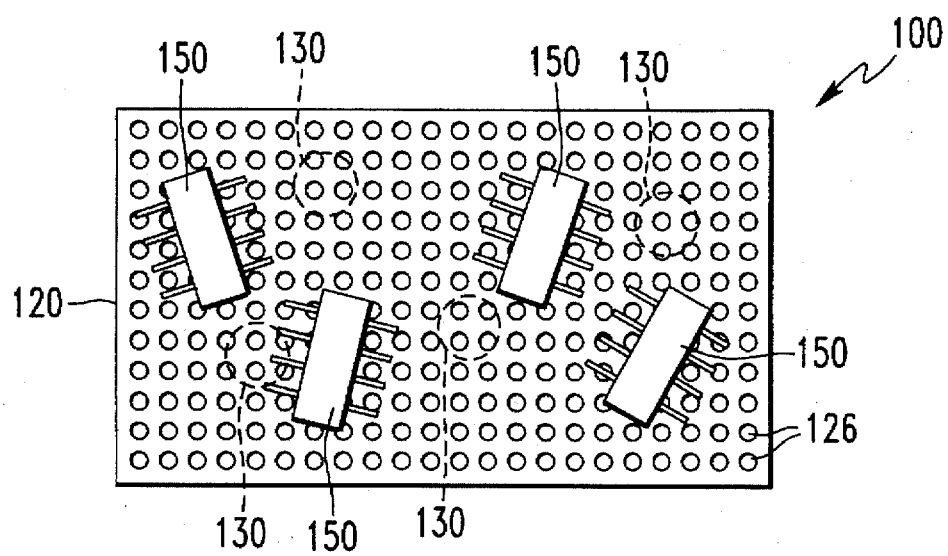
FIG. 1 shows a top view of an embodiment showing a rectangular perforated plate separated with magnets fixed to the plate for supporting ICs for transport.
Figure 2:
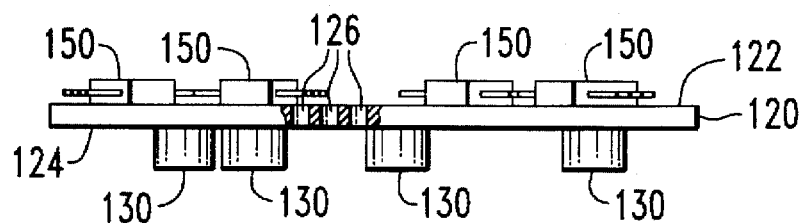
FIG. 2 is a side view of the first embodiment of FIG. 1.
Figure 3:
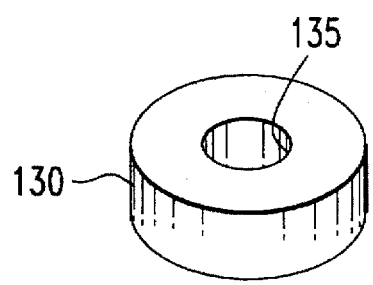
FIG. 3 is a perspective view of the magnets with drainage holes that are used to maintain the circuits in place on the support plates.

The first embodiment of the invention is illustrated in FIGS. 1 through 3 The assembly 100 has ICs 150 located on support plates 120. The invention can transport ICs 150 such as but not limited to integrated circuits, an integrated circuit package or a circuit die. The ICs 150 are held on support plate 120 with magnets 130. The magnets 130 provide an adequate magnetic field which allows the ICs 150 to be held in a fixed position on the support plate 120, and also allows the ICs 150 to be easily removed from the support plate 120 by the operators during the manufacturing process.

The support plate 120, as shown in FIG. 2, has two opposing planar surfaces 122 and 124. A typical material for the metal plate 120 is stainless steel, nickel or anodized aluminum, or its equivalents. Perforations, 126 in support plate 120, allows air and liquids to flow through the support plate 120. The perforations 126 also allows the chemicals and gases to flow away from the ICs 150.

Referring to FIG. 3, magnets 130 are generally round and can be formed of suitable materials which provide a strong magnetic attraction. Preferably, magnets 130 are made of material such as iron, or rare earth that provides a strong ability to hold and maintain a magnetic field and is also non-corrosive. The magnets 130 can be any shape and size suitable to provide the necessary magnetic field to hold the ICs 150 and not interfere with the processing and transporting of the ICs 150 during the manufacturing process. Drainage, through the magnets 130, can be accomplished by holes 135. Holes 135 and perforations 126 in the support plate 120 optimizes and allows for quick drainage of costly fluids from the assemblies 100.

The holes 135 in the magnets 130 and perforations 126 in the support plate 120 increase the air convection and gas flow to the ICs 150 during transport and allow handlers to visually locate and inspect the ICs 150. Finally, the holes 135 and perforations 126 reduce the surface contact between the ICs 150 and the magnetic basket assemblies described below. Since there is less surface contact, the chances of contamination from foreign materials on the ICs 150 and marring or scratching the ICs 150 is reduced.

Figure 4:
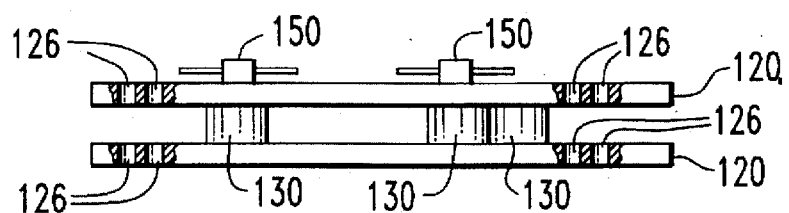
FIG. 4 is a side view of a pair of support plates held together with magnets, with the ICs held on the support plates by the magnets.

In FIG. 4, the magnets 130 are placed between a pair of perforated plates 120. On one planer surface of each support plate 120, the magnets 130 are fixed. The magnets 150 are of sufficient strength to exert attractive forces to hold plates 120 parallel to each other being separated from each other by the thickness of the magnets 130. ICs 150 are positioned on the opposite planar surface of the support plates 120 from the magnets 130. The ICs 150 do not have to be positioned directly above each of the magnets 130. Thus, many ICs 150 can be held by the magnets 130.

Figure 5:
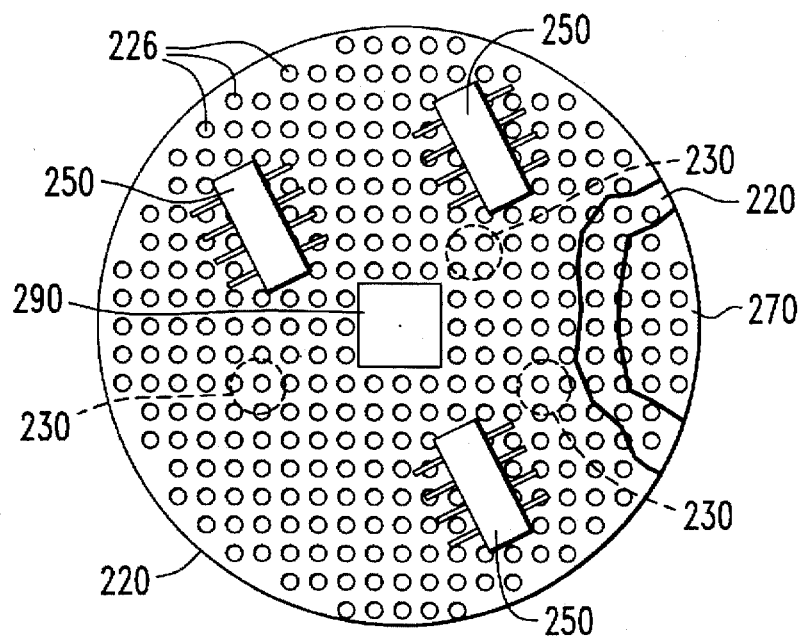
FIG. 5 is an top view of the second embodiment of the invention showing a circular perforated plate with magnets attached to the plate which supports ICs for transport.

Referring to FIG. 5, a second embodiment of the invention provides two circular perforated planar support plates 220 magnets 230 and a separator plate 270. Again, the support plates 220 have opposing planar surfaces.

Figure 6:
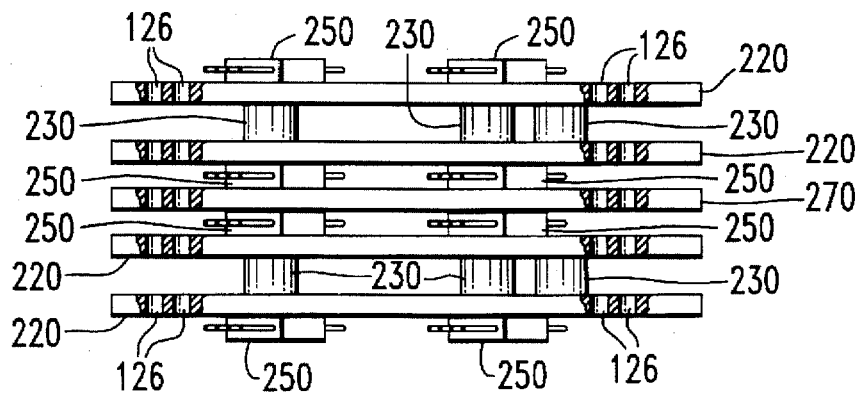
FIG. 6 is a side view of a plurality of stacked support plates stacked in pairs, with each pair of support plates separated from another pair by a separator plate.
Figure 7:
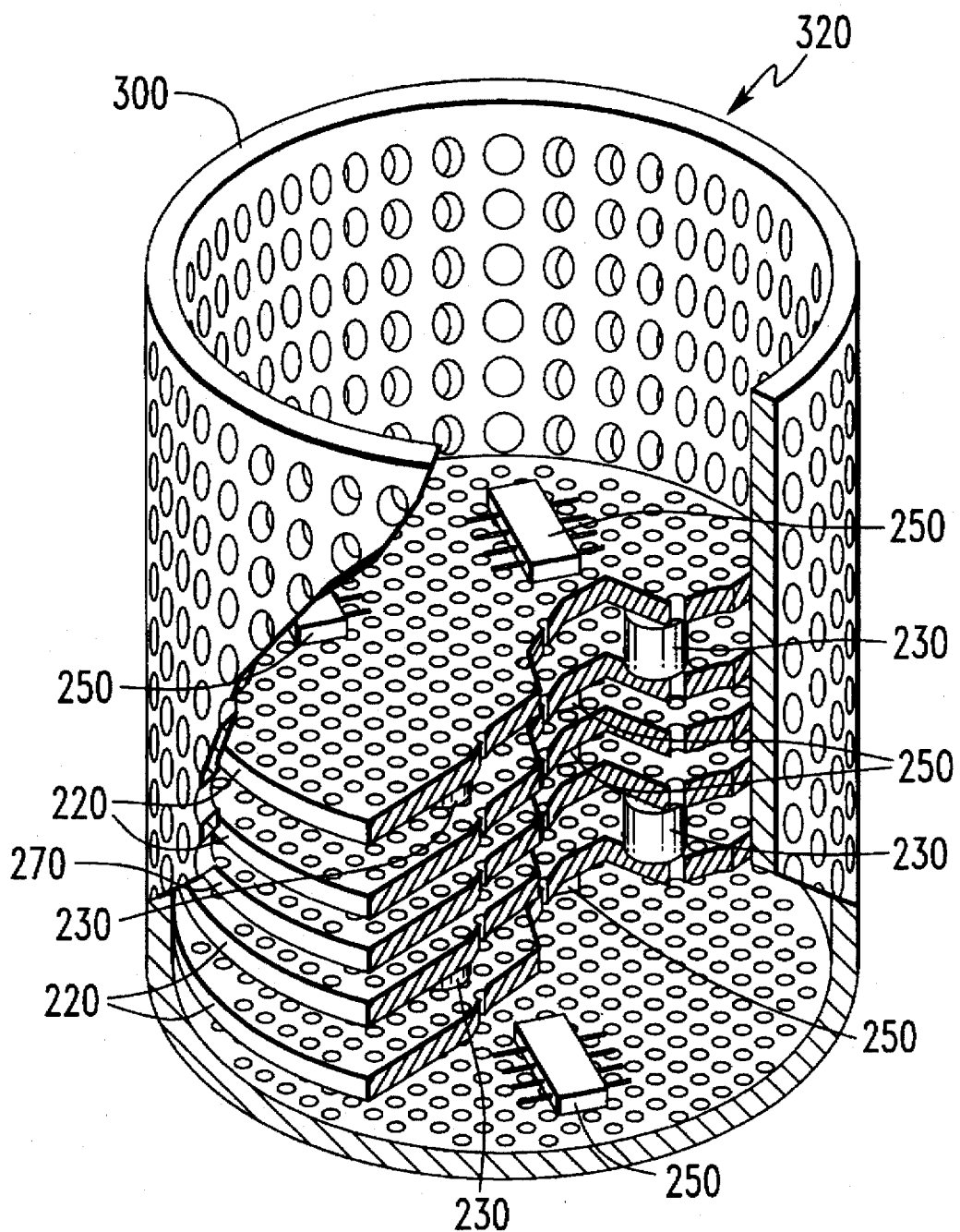
FIG. 7 is a perspective view of a perforated cylindrical container with support plates, magnets, separator plates and ICs.

In FIG. 6, a stacked pair of parallel support plates 220, and magnets 230, are separated from another pair of support plates 220 and magnets 230 by the separator plate 270. The plurality of stacked pairs of support plates are inserted within a cylindrical perforated container 300 for transportation, as shown in FIG. 7. As stated above, the support plates 220 and separator plate 270 can be made of anodized aluminum, nickel, stainless steel or the like.

The perforated separator plate 270 or support plates 220 can be provided with a marker 290, as shown in FIG. 5, such as a piece of metal attached thereto or the separator plate 270 may itself be a different color from the support plate 220. The marker 290 allows the operator to distinguish between the support plates 220 and the separator plates 270. The separator plate 270 is made of different material so that the separator plate 270 will not affect the surface of the ICs 250. The separator plate 270 is preferably aluminum such that the separator plate 270 does not mar or scratch the surface of the ICs 250.

The assembly 320, as shown in FIG. 7, has magnets 230 placed between the perforated plate 220. Again, as stated above, the magnets 230 are of sufficient strength to exert attractive forces to hold the plates 220 parallel each other. ICs 250 are positioned on the surface of the support plate 220 opposite the magnets 230. As stated above, the ICs 250 can be arranged in any manner on the surface of the support plate 220 which prevents the ICs 250 from contacting each other. The separator plate 270 is positioned between each pair of parallel support plates 220. It should be understood that a plurality of pairs of plates 220 can be position parallel each the such that an unlimited amount of ICs can be supported by the present invention depending upon how many pairs of support plates 220 are stacked upon each other.

The pairs of support plates 220 are placed within the cylinder shaped basket 300 forming basket assemblies 320 for transporting and processing the ICs 250 during the manufacturing process. Similair to the other support plates 220, cylinder shaped basket 300 is perforated and formed from stainless steel, anodized aluminum, nickel, or the like.

The invention disclosed can be utilized and modified for special applications such as for hermetic testing. In this type of testing, integrated circuits fixed to the support plates 220 are placed into the baskets 300 and five baskets assemblies 320 are then stacked and placed in a chamber for pressurization. The magnetic forces of the magnets 230 of the present invention are strong enough to hold the integrated circuits 250 in place during pressurization in both fluid and gaseous environments. Also the production operators can perform testing on the ICs 250 in each basket assembly 320 without handling any of the ICs 250 directly. As stated above, the non-handling of the ICs prevents any contamination on the ICs, which may inhibit the branding of the ICs and further prevents damage to the ICs due to ESD.

After all the ICs in baskets assemblies 320 have been tested, the baskets can be restacked and transported to the next operation in the assembly line. During hermetically testing it is important that the baskets and the magnets be comprised of materials that do not absorb radioactive energy. Further, these materials need to withstand temperature from +165° C. to −70° C. without loss of magnetic strength nor exhibiting any corrosive effects. Further, the materials used in the magnets and perforated plates for this testing application must be conducive to heat transfer.

The invention by its design provides several beneficial results. First, yield loss due to foreign materials on integrated circuit parts has been reduced to approximately 4% compared to approximately 20% before using the basket assemblies. Second, inspection time over prior transport methods has been reduced. Third, ESD damage to integrated circuit parts has been reduced. Fourth, prior handling problems such as damaged and bent leads has been reduced.

Although the embodiments described use rectangular or circular shape and comprise of stainless steel, different shapes of various material can be used as desired by one skilled in the art.

Accordingly, while the forms of apparatus herein described, constitutes preferred embodiments of this invention it is to be understood that the invention is not limited to theses precise forms of apparatus, and that changes may be made in either without departing from the scope of the invention, which is defined in the appended claims.

What is claimed is:

1. An apparatus for transporting an integrated circuit during a manufacturing process, comprising;
   a substantially planar support plate having a first and second planar opposing surfaces; and
   at least one magnet placed on the first planar surfaces of the support plate, the magnet maintaining the integrated circuit against and in a fixed position to the second planar surface of the support plate during the transporting of the integrated circuit;
   a basket for holding the support plate, at least one magnet and integrated circuit therein; and
   wherein the support plate and basket have a plurality of perforations for allowing gases or fluids to flow through the perforations and drain away from the integrated circuits.

2. The apparatus of claim 1 wherein the support plate and basket comprise of material selected from the group comprising, nickel, anodized aluminum, and stainless steel.

3. The apparatus of claim 1 wherein the magnet consists of material selected from the group comprising iron and rare earth.

4. An assembly for holding integrated circuits during a manufacturing process comprising:
   at least two pairs of substantially planar support plates, each support plate having a first and second planar opposing surfaces and a plurality of perforations therein;

at least one magnet placed between each one pair of support plates adjacent to the first planar surfaces of each support plate, the magnet maintaining the pair of support plates parallel each other and maintaining the integrated circuits against and in a fixed position to the second planar surface of each support plate;

at least one separator plate, having a plurality of perforations therein, positioned between two pairs of support plates adjacent the integrated circuits for separating the pairs of support plates and integrated circuits of each support plate and protecting the integrated circuits fixed to one pair of support plates from contacting the integrated circuits fixed to another pair of support plates;

a basket, having a plurality of perforations therein, for holding the plurality of support plates, at least one separator plate, the magnets and integrated circuits therein.

5. The assembly of claim 4 wherein at least one magnet consist of metal selected from the group comprising iron and rare earth.

6. The apparatus of claim 3 wherein the basket, and support plates consist of material selected from the group comprising stainless steel, anodized aluminum and nickel.

7. An assembly for transporting metallic products for maintaining the products in a fixed position comprising:

a pair of substantially planar support plates each having a plurality of perforations therein and a first and second planar surface;

at least one magnet disposed between the pair of support plates against one of said first or second planar surfaces, the magnet maintaining the products against and in a fixed position to the other second or first planar surface of the support plates; and a container for containing the support plate and magnets.

8. The assembly of claim 7 further comprising;

a plurality of pairs of support plates;

at least one separator plate, having a plurality of perforations therein, the separator plate positioned between each pairs of support plates, the separator plates positioned adjacent and in contact with the products magnetically fixed to each pair of support plates and preventing the products magnetically fixed to each pair of support plates from contacting each other.

9. The assembly of claim 8 wherein the support plate and container consist of material selected from the group comprising stainless steel, nickel and anodized aluminum.

10. The assembly of claim 7 wherein said separator plates consist of aluminum.

11. The assembly of claim 7 wherein said at least one magnet consist of metal selected from the group comprising iron and rare earth.

* * * * *